United States Patent [19]

Minami

[11] 4,099,251
[45] Jul. 4, 1978

[54] ANALOG ACCUMULATOR MEMORY DEVICE

[75] Inventor: Shunji Minami, Katano, Japan

[73] Assignee: Matsushita Electric Industrial Co., Ltd., Osaka, Japan

[21] Appl. No.: 754,005

[22] Filed: Dec. 27, 1976

[30] Foreign Application Priority Data

Dec. 26, 1975 [JP] Japan .................... 50-159390

[51] Int. Cl.² .................... G06G 7/14; G11C 27/02
[52] U.S. Cl. .................... 364/829; 364/862; 365/45; 340/347 SH
[58] Field of Search .................... 340/173 CA, 347 SH; 235/193, 183; 364/811, 829, 834, 862

[56] References Cited

U.S. PATENT DOCUMENTS

| 3,074,642 | 1/1963 | Sanders | 235/193 |
| 3,171,986 | 3/1965 | Bonner et al. | 235/183 |
| 3,617,725 | 11/1971 | Smith | 235/183 |
| 3,667,055 | 5/1972 | Uchida | 235/183 |

Primary Examiner—Terrell W. Fears
Assistant Examiner—Donald McElheny
Attorney, Agent, or Firm—Burgess, Ryan and Wayne

[57] ABSTRACT

Disclosed is an analog accumulator memory device of the type including a first and a second analog voltage memory devices each capable of holding an output voltage equal in magnitude to an input voltage. An output terminal of an inverter with a unit gain and an external input terminal are connected to an inverting input terminal and a noninverting input terminal, respectively, of a differential amplifier with a unit gain, the output terminal of which is connected to an input terminal of the first analog voltage memory device whose output terminal is connected to an input terminal of the second analog voltage memory device with its output terminal connected to an inverting input terminal of the inverter. Switching means is provided for alternately applying a gate signal to gate terminals of the first and second analog voltage memory devices, whereby an analog quantity (voltage in this case) at the external input terminal may be added to the sum of analog quantities stored in the accumulator device.

5 Claims, 5 Drawing Figures

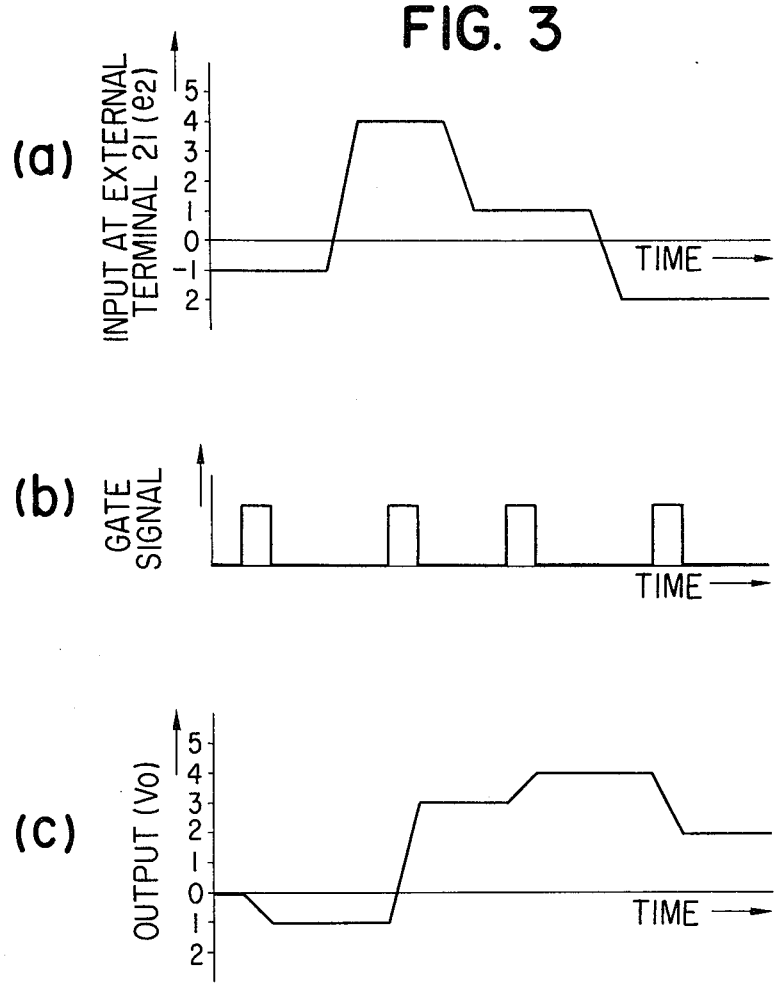
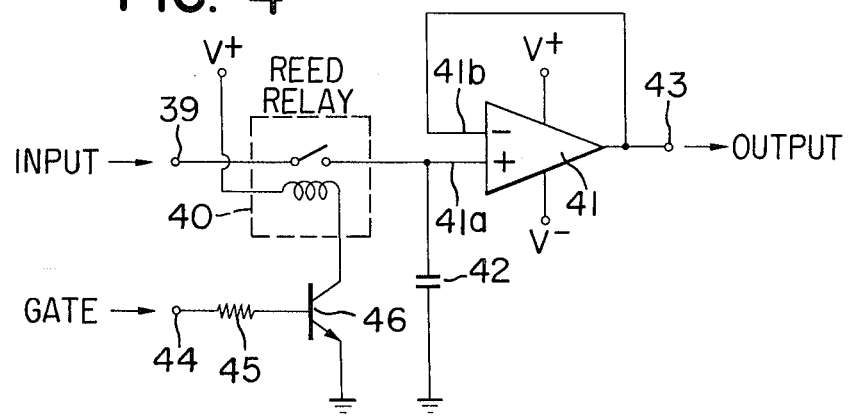

ANALOG ACCUMULATOR MEMORY DEVICE

BACKGROUND OF THE INVENTION

The present invention relates to an analog accumulator memory device.

So far the accumulators have been all of the digital type consisting of digital registers and adders, but no analog accumulator has been ever devised and demonstrated as in the instant invention.

SUMMARY OF THE INVENTION

The primary object of the present invention is therefore to provide an analog accumulator memory device which may accumulate analog quantities and will play a very important and useful role in analog systems and arithmetic operations in the future.

To this end, briefly stated, the present invention provides an analog accumulator memory device comprising an inverter circuit with a unit gain, a differential amplifier with a unit gain and with its noninverting input terminal connected to an external input terminal and its inverting input terminal connected to an output of the inverter circuit, a first analog voltage memory device with its input terminal connected to an output terminal of the differential amplifier, whereby an output voltage equal in magnitude to an input voltage may be derived and held at an output terminal thereof, a second analog voltage memory device with its input terminal connected to the output terminal of the first analog voltage memory device, whereby an output voltage equal in magnitude to an input voltage may be derived and held at an output terminal thereof, and driving signal application means for alternately applying a driving signal to accumulating input terminals of the first and second analog voltage memory devices, whereby an analog quantity applied to the external input terminal may be accumulated.

BRIEF DESCRIPTION OF THE DRAWINGS

FIGS. 3(a), (b) and (c) shown waveforms of an analog input to be accumulated, gate signals and output, respectively, used for the explanation of the present invention;

FIG. 4 is a circuit diagram of another example of an analog voltage memory device used in the present invention.

DESCRIPTION OF THE PREFERRED EMBODIMENTS

Figure 1:
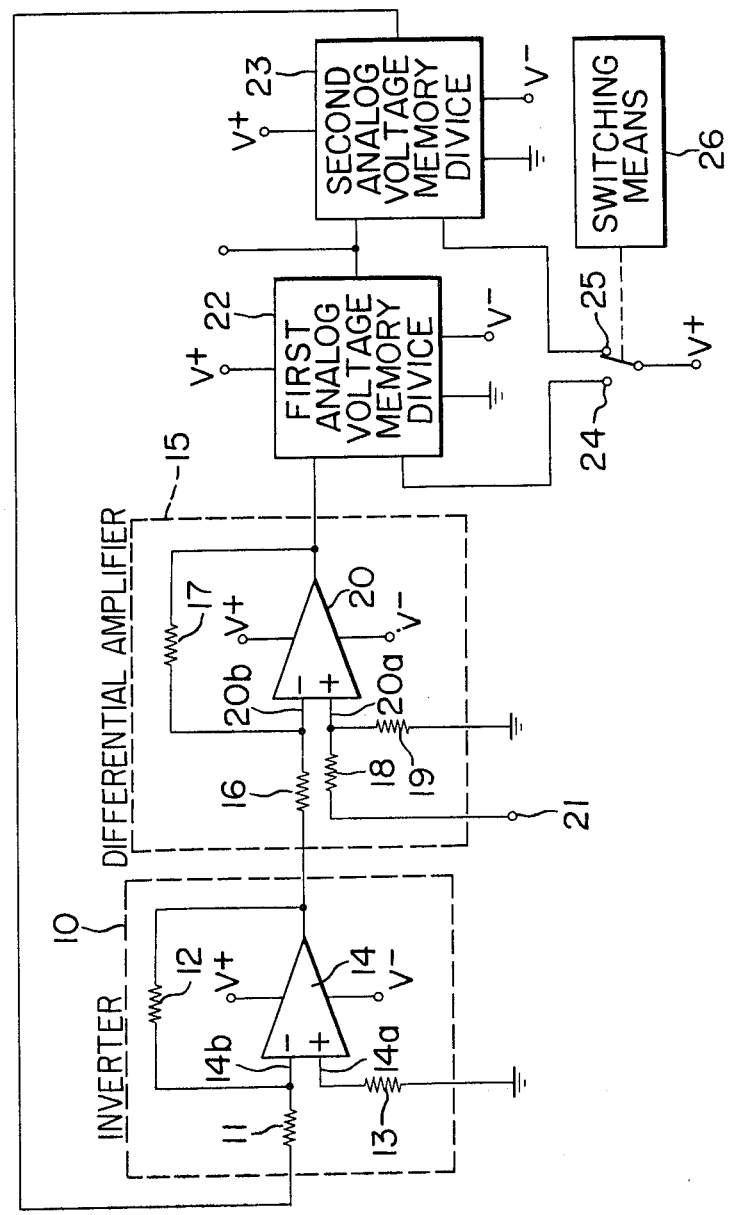
FIG. 1 is a block diagram of a preferred embodiment of an analog accumulator memory device in accordance with the present invention.

In FIG. 1 there is shown a first embodiment of an analog accumulator memory device in accord with the present invention comprising, in general, an inverter 10 consisting of resistors 11, 12 and 13 and an operational amplifier 14; a differential amplifier 15 consisting of resistors 16–19 and an operational amplifier 20; a first and a second analog voltage memory devices 22 and 23; and switching means 26 such as a single-pole, double-throw switch or relay. The operational amplifiers 14 and 20 and the first and second analog voltage memory devices 22 and 23 are connected to a positive and a negative voltage supplies $V^+$ and $V^-$.

The output from the operational amplifier 14 or the inverter 15 is applied through the input resistor 16 to an inverting input terminal 20b of the operation amplifier 20, the output of which is applied to an input terminal of the first analog voltage memory device 22, the output of which is in turn applied to an input terminal of the second analog voltage memory device 23, the output of which is in turn applied through the input resistor 11 to an inverting input terminal 14a of the operational amplifier 14. The switching means 26 alternately connects the positive voltage supply $V^+$ to either of gate terminal 24 or 25 of the first and second analog voltage memory devices 22 and 23 for the purpose to be described below. A noninverting input terminal 14a of the operational amplifier 14 is grounded through the resistor 13, and a noninverting input terminal 20a of the operational amplifier 20 is not only grounded through the resistor 19 but also connected to an exterior or addend input terminal 21.

Figure 2:
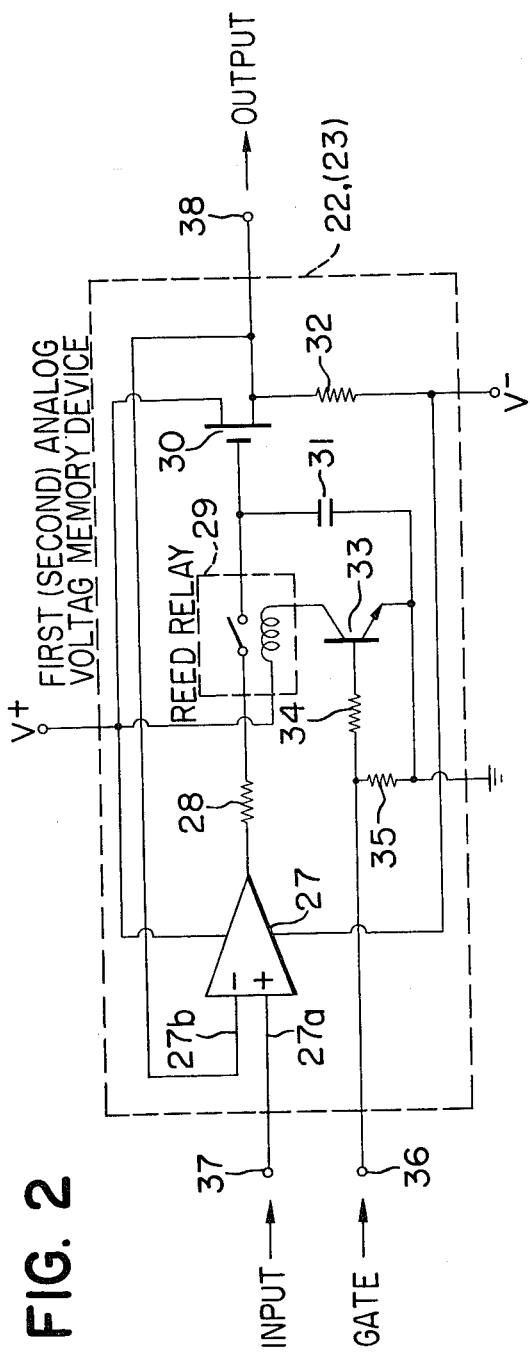
FIG. 2 is a circuit diagram of an analog voltage memory device used in the embodiment shown in FIG. 1.

As shown in FIG. 2, the first and second analog voltage memory devices 22 and 23 are similar in construction. An input terminal 37 which is connected to the output terminal of the operational amplifier 20 or the first analog voltage memory device 22 is connected to a noninverting input terminal 27a of an operational amplifier 27 having its output terminal connected through an input resistor 28 to a movable terminal of a reed relay 29 with its stationary terminal connected to the gate of a MOS field-effect transistor 30 with its drain connected to the positive supply $V^+$ and source, to the negative voltage supply $V^-$ through an output resistor 32, to an output terminal 38 and to an inverting input terminal 27b of the operational amplifier 27. A gate terminal 36 which is connected to the terminal 24 or 25 is connected to a junction between one ends of resistors 34 and 35, and the other end of the resistor 34 is connected to the base of a switching transistor 33 with its collector connected to the positive voltage supply $V^+$ through a coil of the reed relay 29. A nonpolarized capacitor 31 is interconnected between the gate of the field-effect transistor 30 and the emitter of the switching transistor 33, the emitter being in turn connected to the other end of the resistor 35 and grounded.

An input voltage $Vi$ applied to the input terminal 37 of the analog voltage memory device 22 or 23 with above construction results in a source-follower output voltage $Vo$ at the output terminal 38, which $Vo$ is applied to the input terminal of the second analog voltge memory device 23 or to the inverting input terminal 14b of the operational amplifier 14. When an input voltage $Vi$ is higher than an output voltage $Vo$, an output from the operational amplifier 27 is positive. Meanwhile a gate signal at the gate terminal 36 enables the switching transistor 33 to conduct so that current flowsthrough the coil of the reed relay 29 to close its terminals. As a result, the output from the operational amplifier 27 is applied to the capacitor 31 and the gate of the field-effect transistor 30 so that the capacitor 31 is charged and the transistor 30 is enabled to conduct when it has been turned off or the output voltage $Vo$ increases. When the output voltage $Vo$ becomes equal to the input voltage $Vi$, the charging of the capacitor 31 is interrupted, and upon removal of the gate signal at 36 the relation $Vi = Vo$ may be held. On the other hand, when an input voltage $Vi$ is lower than an output voltage $Vo$, an output from the operational amplifier 27 is negative, and when the terminals of the reed relay 29 are closed in response to a gate signal in a manner substantially similar to that described above, the capacitor 31 is discharged so that the output voltage is decreased until $Vi = Vo$. Then the discharging of the capacitor 31 is interrupted and the relation $Vi = Vo$ may be held.

Next referring back to FIG. 1 the mode of operation of the analog accumulator memory device will be described. An output voltage $Vb$ from the second analog voltage memory device 23 applied to the inverting input terminal 14b of the operational amplifier 14 in the inverter 10 results in an output $e1$; that is, $$e1 = - (R2/R1) \cdot Vb$$

where $R1$ and $R2$ = resistance of the resistors 11 and 12, respectively. When $R1 = R2$, gain is unity so that $$e1 = Vb \tag{1}$$

In response to an exterior input or addend $e2$ at the noninverting input terminal 20a and to the output $e1$ at the inverting input terminal 20b of the operational amplifier 20 in the differential amplifier 15, an output $e0$ is derived which is given by $$e0 = [R7/(R6+R7)] \cdot [(R4+R5)/R4] \cdot e2 - R5/R4 \cdot e1$$

where R4-R7 = values of the resistors 16-19, respectively. When $R4 = R5 = R6 = R7$, gain is unity. Therefore $$e0 = e2 - e1 \tag{2}$$

Assume that when the switching means 26 closes the terminal 25 of the second analog voltage memory device 23 an output voltage $Vb$ of the first analog voltage memory 22 be held at E1. Then when the switching means 26 opens the terminal 25 while closing the terminal 24 of the first analog voltage memory device 22, an output voltage $Vb$ from the second analog voltage memory 23 is held equal to the output voltage $Vb$ (in this case, E1) from the first analog voltage memory device 22. Therefore from Eqs. (1) and (2), an output $e0$ of the differential amplifier 15 is given by $$e0 = e2 - (-E1) = e2 + E1$$

When the switching transistor 33 is turned on so that the reed relay 19 is closed, the first analog voltage memory device 22 which is a voltage follower consisting of the operational amplifier 27 and the field-effect transistor 33 (See FIG. 2) gives an output $Va$ $$Va = e2 + E1$$

When the switching means 26 opens the terminal 24 while closing the terminal 25, the first analog voltage memory device 22 holds the output $Va = e2 + E1$, whereas the second analog voltage memory device 23 gives an output voltage $Vb = e2 + E1$.

In response to the next external or addend input $e2'$, the same operation is cycled so that $$Va = E1 + e2 + e2'.$$

Thus everytime when the switching means 26 closes the terminal of the first analog voltage memory device 22, external or addend inputs are successively accumulated. However, when an external input is negative, it is subtracted from the sum stored in the accumulator memory device.

In summary, in response to the gate signals shown in FIG. 3(b), the external input $e1$ shown in FIG. 3(a) is accumulated so that the output voltage $Va$ of the first analog voltage memory 22 changes as shown in FIG. 3(c).

In FIG. 4 there is shown a circuit diagram of another example of an analog voltage memory device which may be used in the analog accumulator memory device in accordance with the present invention. An input terminal 39 is connected through a reed relay 40 to a noninverting input terminal 41a of an operational amplifier 41, and a capacitor 42 is interconnected between the noninverting terminal 41a and ground. A gate input terminal 44 is connected through a resistor 45 to the base of a switching transistor 46 with its collector connected to the positive voltage source $V^+$ through a coil of the reed relay 40 and its emitter grounded. In response to a gate signal applied to the gate input terminal 44, the switching transistor 46 is enabled to conduct so that the coil of the reed relay 40 is energized to close its terminals. As a consequence, the capacitor 42 is charged to a level equal to that of an input voltage applied to the input terminal 39, and a voltage across the capacitor 42 is transferred into an output voltage at an output terminal 43 of the operational amplifier 41 which is a voltage follower. A magnitude of the output voltage at 43 is equal to that of the voltage across the capacitor 42, and no loading-down of the latter occurs because of a very high input impedance of the operational amplifier 41 and a virtually infinite impedance of the opened reed relay 40.

Figure 5:
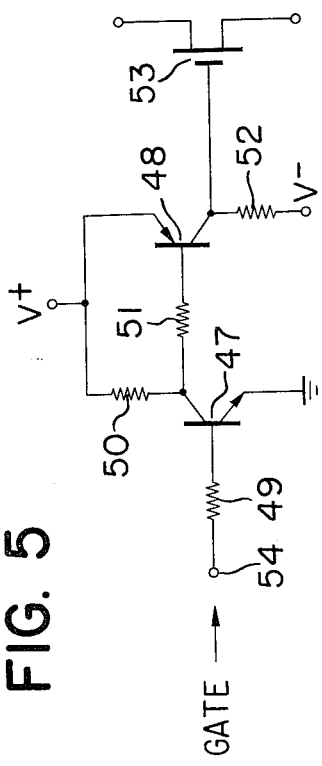
FIG. 5 is a circuit diagram of an electronic switch used in the analog voltage memory devices used in the present invention.

In the analog voltage memory devices shown in FIGS. 2 and 4, the reed relay 29 or 40 is used, but an electronic switch as shown in FIG. 5 may be also used. It consists of two transistors 47 and 48, a MOS field-effect transistor 53 and biasing resistors 49-52 and in response to a gate signal applied to a gate terminal 54, the field-effect transistor 53 is turned on.

As described above, the present invention has succeeded in providing an analog accumulator memory device capable of accumulating and holding pure analog quantities by the operation of switching means, which device will play a very useful role in the future analog computers and will find a variety of useful applications in many fields.

What is claimed is:

1. An analog accumulator memory device, comprising:
    (a) an inverter circuit with a unit gain,
    (b) a differential amplifier with a unit gain and with a noninverting input terminal connected to an external input terminal and an inverting input terminal connected to an output terminal of said inverter circuit,
    (c) a first analog voltage memory device with its input terminal connected to an output terminal of said differential amplifier, whereby an output voltage equal in magnitude to an input voltage may be derived and held at an output terminal,
    (d) a second analog voltage memory device with its input terminal connected to said output terminal of said first analog voltage memory device, whereby an output voltage equal in magnitude to an input voltage may be derived and held at an output terminal thereof, each of said devices having a gate terminal for receiving a driving signal to enable the corresponding device,
(e) driving signal application means for alternately applying a driving signal to the gate terminals of said first and second analog voltage memory devices, and
(f) a feedback connection between the output terminal of said second analog voltage memory device and the input terminal of said inverter circuit.

2. An analog accumulator memory device as set forth in claim 1 wherein
each of said first and second analog voltage memory devices comprises
(a) an operational amplifier having a noninverting input terminal applied with an input,
(b) switching means with its one end connected through an input resistor to an output terminal of said operational amplifier,
(c) a MOS field-effect transistor with its gate connected to the other end of said switching means and its source connected to an inverting input terminal of said operational amplifier,
(d) a nonpolarized capacitor interconnected between the gate of said MOS field-effect transistor and ground, and
(e) an output resistor interconnected between the source of said MOS field-effect transistor and a negative voltage supply.

3. An analog accumulator memory device as set forth in claim 2 wherein
said switching means includes an MOS field-effect transistor.

4. An analog accumulator memory device as set forth in claim 1 wherein
each of said first and second analog voltage memory devices comprising
(a) switching means with its one end connected to an input terminal,
(b) an FET input operational amplifier with its noninverting input terminal connected to the other end of said switching means and its output terminal connected to its inverting input terminal, and
(c) a nonpolarized capacitor interconnected between the noninverting input terminal of said operational amplifier and ground.

5. An analog accumulator memory device as set forth in claim 4 wherein
said switching means includes an MOS field-effect transistor.

* * * * *

UNITED STATES PATENT OFFICE
CERTIFICATE OF CORRECTION

Patent No. 4,099,251        Dated July 4, 1978

Inventor(s) Shunji Minami

It is certified that error appears in the above-identified patent and that said Letters Patent are hereby corrected as shown below:

In the drawings, Fig. 1: "DIVICE" (2 occurrences) should be --DEVICE--.

In the title page, in the title drawing: "DIVICE" (2 occurrences) should be --DEVICE--.

Column 1, line 46: "shown" should be --show--.

Column 2, line 50: "voltge" should be --voltage--.

Column 3, last line - Column 4, line 1: "substracted" should be --subtracted--.

Signed and Sealed this

Fifteenth Day of May 1979

[SEAL]

Attest:

RUTH C. MASON
Attesting Officer

DONALD W. BANNER
Commissioner of Patents and Trademarks